(12) United States Patent
Hetzler

(10) Patent No.: US 9,983,804 B2
(45) Date of Patent: *May 29, 2018

(54) SKEWING EXPECTED WEAROUT TIMES OF MEMORY DEVICES

(71) Applicant: International Business Machines Corporation, Armonk, NY (US)

(72) Inventor: Steven R. Hetzler, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/633,585

(22) Filed: Jun. 26, 2017

(65) Prior Publication Data

US 2017/0293438 A1 Oct. 12, 2017

Related U.S. Application Data

(63) Continuation of application No. 14/994,890, filed on Jan. 14, 2016, which is a continuation of application No. 14/149,770, filed on Jan. 7, 2014, now Pat. No. 9,274,711, which is a continuation of application No. 12/420,607, filed on Apr. 8, 2009, now Pat. No. 8,661,187.

(51) Int. Cl.
*G06F 12/00* (2006.01)
*G06F 3/06* (2006.01)

(52) U.S. Cl.
CPC .......... *G06F 3/0616* (2013.01); *G06F 3/0631* (2013.01); *G06F 3/0679* (2013.01); *G06F 2212/7202* (2013.01); *G06F 2212/7211* (2013.01)

(58) Field of Classification Search
None
See application file for complete search history.

(56) References Cited

U.S. PATENT DOCUMENTS

| | | | |
|---|---|---|---|
| 6,000,006 A | 12/1999 | Bruce et al. | |
| 6,684,287 B1 | 1/2004 | Ng | |
| 7,073,115 B2 | 7/2006 | English et al. | |
| 7,313,645 B2 | 12/2007 | Hasegawa | |
| 7,353,325 B2 | 4/2008 | Lofgren et al. | |
| 7,865,761 B1 | 1/2011 | Chilton | |
| 8,554,983 B2 | 10/2013 | Jeddeloh | |
| 8,661,187 B2 | 2/2014 | Hetzler | |
| 9,274,711 B2 | 3/2016 | Hetzler | |
| 9,798,476 B2 | 10/2017 | Hetzler | |
| 2007/0233931 A1 | 10/2007 | Tanaka et al. | |

(Continued)

OTHER PUBLICATIONS

Hetzler, S.R., U.S. Appl. No. 12/420,607, filed Apr. 8, 2009.
(Continued)

*Primary Examiner* — Baboucarr Faal
(74) *Attorney, Agent, or Firm* — Zilka-Kotab, P.C.

(57) ABSTRACT

Aspects of the present invention include a system, method, and computer program product for skewing expected wearout times of memory devices in an array are provided according to some embodiments of the present invention. In general, the method includes determining or receiving an amount of spare space to provide in an array of memory devices, allocating the spare space non-uniformly to the memory devices in the array, and skewing expected wearout times of the memory devices by controlling writing of data to the array according to the allocation of the spare space.

18 Claims, 5 Drawing Sheets

(56) References Cited

U.S. PATENT DOCUMENTS

| | | |
|---|---|---|
| 2008/0140918 A1 | 6/2008 | Sutardja |
| 2010/0262793 A1 | 10/2010 | Hetzler |
| 2014/0129762 A1 | 5/2014 | Hetzler |
| 2016/0124662 A1 | 5/2016 | Hetzler |

OTHER PUBLICATIONS

Non-Final Office Action from U.S. Appl. No. 12/420,607, dated Sep. 14, 2011.
Non-Final Office Action from U.S. Appl. No. 12/420,607, dated Dec. 13, 2012.
Final Office Action from U.S. Appl. No. 12/420,607, dated Mar. 9, 2012.
Final Office Action from U.S. Appl. No. 12/420,607, dated Jul. 18, 2013.
Notice of Allowance from U.S. Appl. No. 12/420,607, dated Oct. 9, 2013.
Hetzler, S.R., U.S. Appl. No. 14/149,770, filed Jan. 7, 2014.
Non-Final Office Action from U.S. Appl. No. 14/149,770, dated Jun. 19, 2014.
Final Office Action from U.S. Appl. No. 14/149,770, dated Jan. 12, 2015.
Advisory Action from U.S. Appl. No. 14/149,770, dated Apr. 6, 2015.
Non-Final Office Action from U.S. Appl. No. 14/149,770, dated May 1, 2015.
Ben-Aroya, A., "Competitive Analysis of Flash-Memory Algorithms," Tel-Aviv University, Raymond and Beverly Sackler Faculty of Exact Sciences, School of Computer Science, Apr. 2006, pp. 1-58.
Chang et al., "Endurance Enhancement of Flash-Memory Storage Systems: An Efficient Static Wear Leveling Design," Proceedings of the 44th annual Design Automation Conference, DAC 2007, Jun. 4-8, 2007, pp. 212-217.
Notice of Allowance from U.S. Appl. No. 14/149,770, dated Nov. 6, 2015.
Hetzler, S.R., U.S. Appl. No. 14/995,890, filed Jan. 14, 2016.
Non-Final Office Action from U.S. Appl. No. 14/995,890, dated Aug. 18, 2016.
Final Office Action from U.S. Appl. No. 14/995,890, dated Mar. 24, 2017.
Advisory Action from U.S. Appl. No. 14/995,890, dated May 26, 2017.
Notice of Allowance from U.S. Appl. No. 14/995,890, dated Jun. 16, 2017.
Corrected Notice of Allowance from U.S. Appl. No. 14/995,890, dated Aug. 2, 2017.

UNIT

| Layout | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 1 | --- | 1 | --- | 1 | --- | 1 | 1 | 1 | --- | --- | 1 | 1 | 1 | 1 | 1 |
| 2 | 2 | 2 | --- | --- | 2 | --- | 2 | 2 | 2 | --- | --- | 2 | 2 | 2 | 2 | 2 |
| 3 | 3 | 3 | 3 | --- | --- | 3 | --- | 3 | 3 | --- | --- | --- | 3 | 3 | 3 | 3 |
| 4 | 4 | 4 | 4 | 4 | --- | --- | 4 | 4 | --- | --- | --- | 4 | 4 | 4 | 4 | 4 |
| 5 | 5 | 5 | 5 | 5 | --- | --- | 5 | 5 | --- | --- | --- | 5 | 5 | 5 | 5 | 5 |
| 6 | 6 | 6 | 6 | 6 | --- | 6 | 6 | --- | --- | --- | --- | 6 | 6 | 6 | 6 | 6 |
| 7 | 7 | 7 | 7 | 7 | --- | 7 | 7 | --- | --- | --- | --- | 7 | 7 | 7 | 7 | 7 |
| 8 | 8 | 8 | 8 | 8 | 8 | 8 | --- | --- | --- | --- | --- | 8 | 8 | 8 | 8 | 8 |
| 9 | 9 | 9 | 9 | 9 | 9 | 9 | --- | --- | --- | --- | --- | 9 | 9 | 9 | 9 | 9 |
| 10 | 10 | 10 | 10 | 10 | 10 | 10 | --- | --- | --- | 10 | --- | 10 | 10 | 10 | 10 | --- |
| 11 | 11 | 11 | 11 | 11 | 11 | 11 | --- | --- | 11 | 11 | 11 | 11 | 11 | 11 | --- | --- |
| 12 | 12 | 12 | 12 | 12 | 12 | 12 | --- | --- | 12 | 12 | 12 | 12 | 12 | --- | --- | --- |
| 13 | 13 | 13 | 13 | 13 | 13 | 13 | --- | 13 | 13 | 13 | 13 | 13 | --- | --- | --- | --- |
| 14 | 14 | 14 | 14 | 14 | 14 | 14 | 14 | 14 | 14 | 14 | 14 | --- | --- | --- | --- | --- |
| 15 | 15 | 15 | 15 | 15 | 15 | 15 | 15 | 15 | 15 | 15 | 15 | --- | --- | --- | --- | --- |
| 16 | 16 | 16 | 16 | 16 | 16 | 16 | 16 | 16 | 16 | 16 | 16 | --- | --- | --- | --- | --- |
| 17 | 17 | 17 | 17 | 17 | 17 | 17 | 17 | 17 | 17 | 17 | 17 | --- | --- | --- | --- | --- |
| 18 | 18 | 18 | 18 | 18 | 18 | 18 | 18 | 18 | 18 | 18 | 18 | --- | --- | --- | --- | --- |
| 19 | 19 | 19 | 19 | 19 | 19 | 19 | 19 | 19 | 19 | 19 | 19 | --- | --- | --- | --- | --- |
| 20 | 20 | 20 | 20 | 20 | 20 | 20 | 20 | 20 | 20 | 20 | 20 | --- | --- | --- | --- | --- |
| 21 | 21 | 21 | 21 | 21 | 21 | 21 | 21 | 21 | 21 | 21 | 21 | --- | --- | --- | --- | --- |
| 22 | 22 | 22 | 22 | 22 | 22 | 22 | 22 | 22 | 22 | 22 | 22 | --- | --- | --- | --- | --- |
| 23 | 23 | 23 | 23 | 23 | 23 | 23 | 23 | 23 | 23 | 23 | 23 | --- | --- | --- | --- | --- |
| 24 | 24 | 24 | 24 | 24 | 24 | 24 | 24 | 24 | 24 | 24 | 24 | --- | --- | --- | --- | --- |
| 25 | + | + | + | + | + | + | + | + | + | + | + | + | + | + | + | + |
| 26 | + | + | + | + | + | + | + | + | + | + | + | + | + | + | + | + |
| 27 | + | + | + | + | + | + | + | + | + | + | + | + | + | + | + | + |
| 28 | 25 | 25 | 25 | 25 | 25 | 25 | 25 | 25 | 25 | 25 | 25 | 26 | 26 | 26 | 26 | 26 |
| 29 | 26 | 26 | 26 | 26 | 26 | 26 | 27 | 27 | 27 | 27 | 27 | 27 | 27 | 27 | 27 | 27 |
| 30 | 27 | 28 | 28 | 28 | 28 | 28 | 28 | 28 | 28 | 28 | 28 | 28 | 29 | 29 | 29 | 29 |
| 31 | 29 | 29 | 29 | 29 | 29 | 29 | 29 | 30 | 30 | 30 | 30 | 30 | 30 | 30 | 30 | 30 |
| 32 | 30 | 30 | 31 | 31 | 31 | 31 | 31 | 31 | 31 | 31 | 31 | 31 | 31 | 32 | 32 | 32 |
| 33 | 32 | 32 | 32 | 32 | 32 | 32 | 32 | 32 | 34 | 34 | 34 | 34 | 34 | 34 | 34 | 34 |
| 34 | 34 | 34 | 34 | 35 | 35 | 35 | 35 | 35 | 35 | 35 | 35 | 35 | 35 | 35 | 36 | 36 |
| 35 | 36 | 36 | 36 | 36 | 36 | 36 | 36 | 36 | 36 | 37 | 37 | 37 | 37 | 37 | 37 | 37 |
| 36 | 37 | 37 | 37 | 37 | 38 | 38 | 38 | 38 | 38 | 38 | 38 | 38 | 38 | 38 | 38 | 39 |
| 37 | 39 | 39 | 39 | 39 | 39 | 39 | 39 | 39 | 39 | 39 | 40 | 40 | 40 | 40 | 40 | 40 |
| 38 | 40 | 40 | 40 | 40 | 40 | 41 | 41 | 41 | 41 | 41 | 41 | 41 | 41 | 41 | 41 | 41 |

Rows 28–38: UNIFORM DATA

--- Skew Spares
+ Skew Spares

FIG. 3

SKEWING EXPECTED WEAROUT TIMES OF MEMORY DEVICES

BACKGROUND

The present invention relates to memory devices, and more particularly, this invention relates to skewing expected wearout times of memory devices.

NAND flash memory devices possess both finite write/erase endurance and limited data retention. The consequences of an undetected wearout of these memory devices may be severe. For example, data stored in the memory devices may be corrupted. To date, however, proposed solutions have failed to provide acceptable solutions for these and/or other issues associated with these memory devices.

BRIEF SUMMARY

Aspects of the present invention include a system, method, and computer program product for skewing expected wearout times of memory devices in an array are provided according to some embodiments of the present invention. In general, the method includes determining or receiving an amount of spare space to provide in an array of memory devices, allocating the spare space non-uniformly to the memory devices in the array, and skewing expected wearout times of the memory devices by controlling writing of data to the array according to the allocation of the spare space.

Other aspects and advantages of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

For a fuller understanding of the nature and advantages of the present invention, as well as the preferred mode of use, reference should be made to the following detailed description read in conjunction with the accompanying drawings.

FIG. 3 shows a layout which may be used to provide the skewed solution shown in FIG. 2, in accordance with one embodiment.

DETAILED DESCRIPTION

Figure 1:
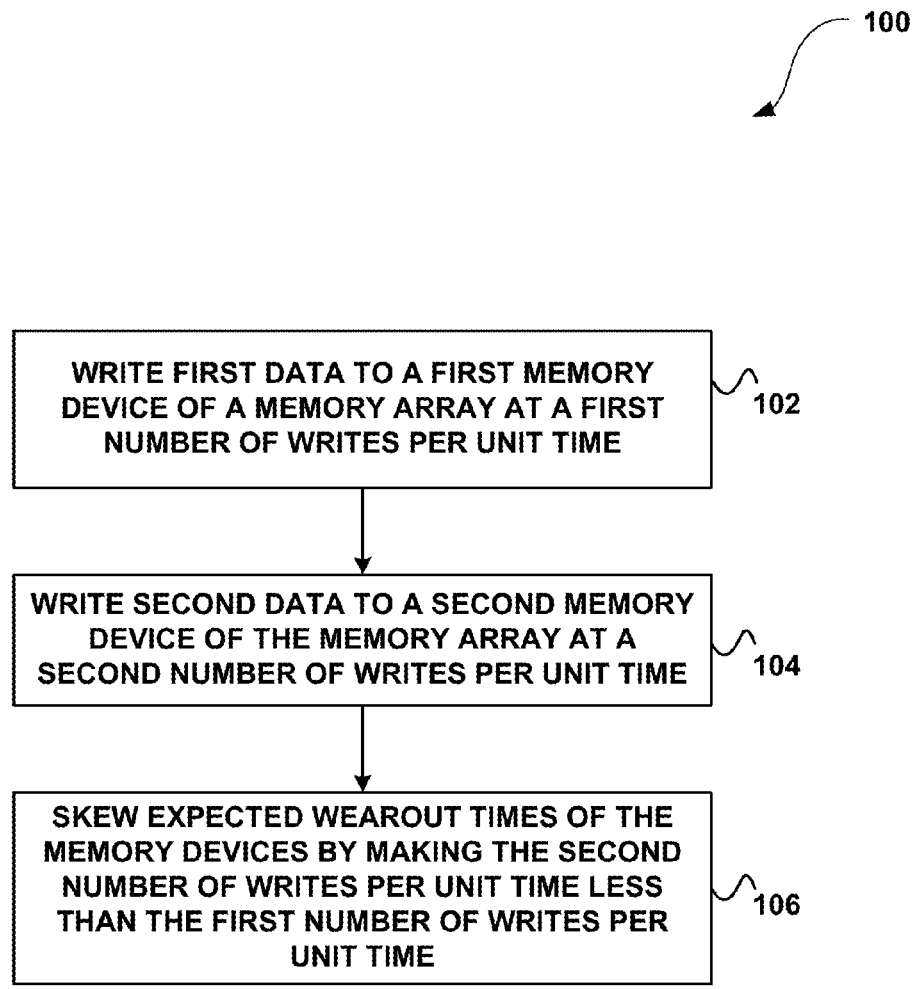
FIG. 1 illustrates a method for skewing expected wearout times of memory devices, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

In one general embodiment, a method is provided for skewing expected wearout times of memory devices. In operation, first data is written to a first memory device of a memory array at a first number of writes per unit time. Additionally, second data is written to a second memory device of the memory array at a second number of writes per unit time. Furthermore, expected wearout times of the memory devices are skewed by making the second number of writes per unit time less than the first number of writes per unit time.

In another general embodiment, a method is provided for skewing expected wearout times of memory devices. In operation, first data is written to a first memory device of a memory array. Additionally, second data is written to a second memory device of the memory array. Furthermore, expected wearout times of the memory devices are skewed by making a number of available storage units on the second memory device less than a number of available storage units on the first memory device.

In another general embodiment, a computer program product is provided including a computer usable medium having computer usable program code embodied therewith. The computer usable program code includes computer usable program code configured to write first data to a first memory device of a memory array at a first number of writes per unit time; computer usable program code configured to write second data to a second memory device of the memory array at a second number of writes per unit time; and computer usable program code configured to skew expected wearout times of the memory devices by making the second number of writes per unit time less than the first number of writes per unit time.

In another general embodiment, a system is provided including logic for writing first data to a first memory device of a memory array at a first number of writes per unit time; logic for writing second data to a second memory device of the memory array at a second number of writes per unit time; and logic for skewing expected wearout times of the memory devices by making the second number of writes per unit time less than the first number of writes per unit time.

In another general embodiment, a system is provided including logic for writing first data to a first memory device of a memory array; logic for writing second data to a second memory device of the memory array; logic for skewing expected wearout times of the memory devices by making a number of available storage units on the second memory device less than a number of available storage units on the first memory device.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without any combination of the other features described.

NAND flash devices possess finite write/erase endurance and finite data retention. The consequences of an undetected wearout are potentially severe. For example, data may be corrupted. When a cell approaches wearout, the decay time for the data may become very short, effectively creating a time-dependent error rate.

Because data may be written in large blocks (e.g. >512 Bytes, etc.) covered by a common error correction code (ECC), it is possible for the error rate to exceed the power of the ECC. This may result in corrupt data being passed as valid on a subsequent read operation. To date, techniques and mechanisms for detecting wearout have not been demonstrated to meet enterprise reliability and data integrity targets. As a result, information technology applications for flash memory devices may utilize RAID technology.

In some cases, NAND storage devices implement a form of wear leveling to increase the time before a first wearout event. A side effect of such an approach is to further enhance wearout, as many blocks will approach wearout at the same time. Thus, it becomes more difficult to design a mitigation mechanism, such as RAID, since the underlying assumption is that all failures are independent of each other and time.

When used in a RAID system, either with RAID 3 type (e.g. full stripe writes) or RAID 5 type (e.g. with parity rotation), the write access to all the units is highly correlated. This may result in a situation where multiple units approach wearout at similar times. Cluster failures may also be a result, where the power of the RAID system itself is exceeded, since the unit failures are no longer independent.

Thus, the correlation between wearout events must be broken in such systems. At least some embodiments provided herein address these and other limitations by providing systems and methods for breaking the write correlation in flash-based RAID systems, thereby preserving the ability of the RAID system to provide the expected level of data protection. These systems and methods work with stripe type (e.g. RAID 3, etc.) and block type (e.g. RAID 6, etc.) systems. The correlation is broken by ensuring that the access patterns to the individual units of a memory array have an enforced skew, which results in a skew in the expected wearout times.

FIG. 1 illustrates a method 100 for skewing expected wearout times of memory devices, in accordance with one embodiment. As shown, first data is written to a first memory device of a memory array at a first number of writes per unit time. See operation 102.

Additionally, second data is written to a second memory device of the memory array at a second number of writes per unit time. See operation 104. The first and second data may include any data capable of being written to memory. Furthermore, in various embodiments, the first and the second data may include the same data or different data.

Additionally, in the context of the present description, a memory device refers to any device capable of storing data. For example, in one embodiment, the memory devices may be flash memory devices (e.g., NAND flash memory, etc.). Furthermore, the first and second memory devices may have any storage capacity sufficient to store the data. In one embodiment, the first and second memory devices may have a different storage capacity.

In another embodiment, the first and second memory devices may have about the same storage capacity. In either case, a number of available storage units (e.g., segments or blocks for data, etc.) on the first memory device may be greater than a number of available storage units on the second memory device.

As an option, the number of available storage units for each memory device may be designated. For example, the designation may include a software based designation and/or a hardware based designation. As another option, a predetermined amount of free space may be provided on each of the memory devices for wear leveling.

Additionally, in one embodiment, a third memory device may be present. In this case, the third memory device may have about a same storage capacity as the first and second memory devices. Further, the number of available storage units in the second memory device may be greater than a number of available storage units in the third memory device. In any case, a write workload may be about even across the available storage units in a particular memory device.

Once the second data is written to the second memory device, expected wearout times of the memory devices are skewed by making the second number of writes per unit time less than the first number of writes per unit time. See operation 106. In another embodiment, the expected wearout times of the memory devices may be skewed by making a number of available storage units on the second memory device less than a number of available storage units on the first memory device. Additionally, as an option, the first data on the first memory device may be replicated on a replacement memory device.

Using the method 100, the write cycle correlation between units may be broken by having a skew in the number of data blocks between units. Equivalently, this may be expressed as a skew in the number of spare blocks per unit. Assuming a roughly even write workload across the data blocks (e.g. which can be achieved by spreading the data across the skewed layout), the result is a skewing of the time to reach the write endurance limit. This will mitigate the clustered wearout that occurs when applying RAID to endurance limited devices. Absent such a breaking of the write correlation, applying RAID to such devices may not significantly improve the failure tolerance, since the failure of one unit due to wearout implies the remaining units are also close to failure.

In most cases, it may be assumed that a roughly uniform interval between device wearout events is desired. This interval should be sufficiently long to allow for replacement of a first worn out unit, and rebuilding of the data before a further unit wears out (typically referred to as Mean Time to Repair (MTTR). Ideally, this interval should be longer than the statistical fluctuation in wearout times as well.

In this case, a uniform write data rate is assumed to allow the wear out interval to be expressed in units of time. If the write data varies, then the maximum data rate may be used to determine the minimum time interval. Lower IO rates will therefore result in longer intervals. Table 1 shows an example of a simple array with skewed spares, in accordance with one embodiment. The elements of array n are with the index n, and the spares are shown as empty.

TABLE 1

| | Unit | | |
|---|---|---|---|
| Layout | 0 | 1 | 2 |
| 1 | 1 | 1 | 1 |
| 2 | 2 | 2 | |
| 3 | 2 | | |

Table 1 shows the affect of attempting to skew sparing on a simple RAID array. In this case, the RAID array is assumed to comprise an array space (M) in units equal to 3 units to provide the proper level of protection. That is, each array layout should have only one element on a given unit.

As can be seen in the example shown in Table 1, layout 1 meets this criterion. However, the attempt to skew the sparing has violated the criterion, as unit 0 has two elements of layout 2. While the sparing achieves the ratio 0:1:2, the RAID array no longer retains its reliability properties. Thus, what is needed is a mechanism for providing skew sparing that preserves the reliability of the RAID array.

Skew sparing can be achieved for an arbitrary array of M units by spreading the data across N>M units, where N is the total number of units and the total spare space is N−M units. This over-provisioning is then spread non-uniformly to affect the skew. In order to wear level, a minimum amount of free space should be provided on each unit as well. Given these definitions, the spare space step size and the amount of over-provisioning required to achieve a linear skew may be determined, as shown in Table 2 below, where sp(n) is the spare space on unit n, WI is the target wearout interval in months, e is the endurance factor in months per unit, and Sk is the skew spare space in units.

TABLE 2

$$sp(n) = \frac{WI}{e} n; \text{Spare space on unit n.}$$

Constraint of total spare space yields:

$$Sk = \frac{WI}{e} \sum_{n=0}^{N-1} n \rightarrow \frac{WI}{e} \sum_{n=0}^{Sk+M-1} n - Sk = 0$$

As an example, a memory array may consist of M=11 units, with a desired WI=1.5 months. Further, the wearout time for the total data space on a unit may be e=36 months, with a minimum free space in units (a) equal to 0.15. In other words, a minimum of 15% of each unit is spare to achieve a 36 month lifetime.

This may be achieved with the addition of Sk=5 spare units, as the sum is 120, and WI/e=1/24. The interval decreases when further spare units are added or removed. The results are shown graphically in FIG. 2.

As shown, the time to wearout is plotted for each unit in a memory system. The normal array with flat sparing has a uniform lifetime for each unit of 36 months*(1+5/16)=47.3 Months. This causes a strong correlation in wearout behavior, which may result in exceeding the power of the RAID code that is used to protect the system.

In the skew case, it can be seen that unit 0 has a lifetime of 38 months, and unit 15 has a lifetime of 58.5 months. Thus, the correlation between wearout times is broken and a RAID code may treat wearout events as isolated failures. The layout aims to achieve a linear sparing arrangement on the units. This may be achieved with any number of array units, spread over a larger number of total units. Any linear arrangement may be broken down into a common fixed value (e.g. the offset), and a pattern with sparing ratios 0:1:2:3: . . . n.

For example, a system may include N total units, with M array units. Thus, the number of spare units is S=N−M. The data layout may include a number of array layouts, with each layout having M data segments and S spare segments. The arrangement of data segments and spare segments in each array layout may be altered to achieve the skew sparing ratios. The total number of spare segments is given by Equation 1.

$$T = \sum_{n=0}^{N-1} n \qquad \text{Equation 1}$$

The number of unique array layouts is shown in Equation 2.

$$a = T/S \qquad \text{Equation 2}$$

A set of unique layouts may be created such that each array layout has S spare segments. This condition maintains the array failure tolerance. Unit n (0<=n<N) will have n spare segments in the set of a layouts. If the units are numbered 0 . . . N−1, the number of array layouts with a spare segment on unit n for the set of layouts may be chosen to be n.

For example, if N=5, and S=2, then T=10 and a=5. Thus, there are 5 unique array layouts. The spare segments may be assigned such that unit 0 has 0 spare segments, unit 1 has 1 spare segment, unit 2 has 2 spare segments, etc. The spares=S constraint per layout may be met by selecting sets of complementary units, where only one member of the set may have a spare segment in a given array layout, subject to Equation 3.

$$\sum_{set\_of\_units} n = T \qquad \text{Equation 3}$$

In other words, in the set of complementary units, the total number of spare segments is the same as the number of unique layouts. Thus, for the above example, the constraint is that the sum of the unit indices, which is set to be the same as the number of spare segments, is 5. In this case, there is one such arrangement: (1, 4); (2, 3).

Table 3 shows an example skew sparing layout for M=3, N=5, and S=2. The occupied cells hold the array segments, and the vacant cells are spares. The numbers in the cell indicate the array layout number.

TABLE 3

| | Unit | | | | |
|---|---|---|---|---|---|
| Layout | 0 | 1 | 2 | 3 | 4 |
| 1 | 1 | | | 1 | 1 |
| 2 | 2 | 2 | | 2 | |
| 3 | 3 | 3 | 3 | | |
| 4 | 4 | 4 | 4 | | |
| 5 | 5 | 5 | 5 | | |

As shown in Table 3, the system has an array size of M=3, along with 2 additional spare units, which allows the array layout properties to be retained while simultaneously achieving a linear skew in the sparing. The array layout criterion of each array layout having only one element on any unit is preserved. It can be seen that relocating any data element on a unit to a spare element on the same unit maintains the array layout criterion. Further, the constraint of S=2 for each array layout is met and the ratio of spare segments in each unit is 0:1:2:3:4.

Larger solutions are also contemplated, such as N=16 and S=5, where T=120 and a=24: (1, 2, 4, 6, 11); (5, 7, 12); (3, 8, 13); (14, 10); (15, 9). The actual layout is shown in FIG. 3, which can be used to provide the skewed solution shown in FIG. 2. It should be noted that this layout also shows rows with uniform sparing and uniform data. As shown, skew spares and uniform spares are indicated by "---" and "+", respectively. Additionally, uniform data is indicated and all other blocks with data indicate skew data. Thus, FIG. 3 identifies which segments are spare and which are data. The actual mapping of user data onto this layout may be achieved in manners well known in the art.

The above technique works when T/S is an integer. In some situations, the approach may be modified to handle non-integer cases. For example, in the case that N=7, S=2, T=21 and a=21/2, a=21 may be used instead by allowing the use of each unit twice. One such solution is (1, 3, 5, 2, 4, 6); (2, 4, 6, 1, 3, 5).

There are some configurations where an exact linear solution is not available, in which case an approximation of the linear sparing is suitable. It should be noted that the goal is to break the correlation in failures to have a minimum sparing difference between units. Of course, there may be situations where arrangements other than full linear are desirable. For example, if other mechanisms contribute to reliability, such as electronic failure, or there may be age effects, and thus a non-linear skewing may be preferred. In the case of an end-of-life failure acceleration, it may be that a super-linear skewing is preferred. Further, a non-linear skew with large time separation between a few units and small time separation between remaining units may be preferred when the goal is to provide an early indication of failure, such that a set of units will be replaced in a common maintenance event.

Once a unit is replaced, one approach is to replicate the data and sparing arrangement of the failed unit on the replacement unit. That means that the contents of the data elements may be rebuilt onto the replacement unit, and that the remaining space is assigned as spares. It should be noted that the layout could be returned to the original for this unit as well.

Figure 2:
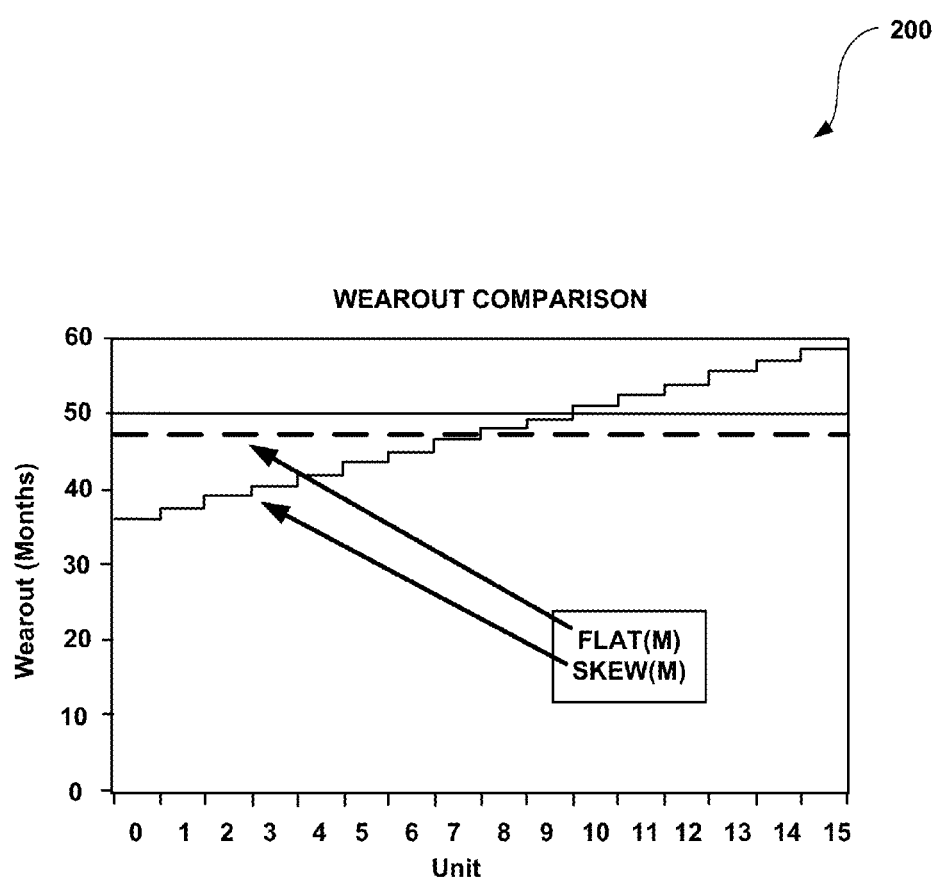
FIG. 2 shows a chart of a comparison of wearout times between flat wear leveling and skew wear leveling, in accordance with one embodiment.

In some situations, the expectation may be that the failures will occur in the skew sequence. In the example of FIG. 2, given the usage pattern assumed, it is anticipated that unit 0 will fail first around month 36. If this occurs, then unit 0 may be replaced and the layout may be replicated. Thus, the next wearout for unit 0 would be expected at month 72 (36+36), which is beyond where unit 15 is expected to fail.

Since there are other failure mechanisms and a uniform raw wearout for the units is an assumption, deviations may be anticipated. In such cases, the replacement policy may still be a simple replication of the layout of the failed unit. However, in some cases, such an approach may increase the failure correlation that the skewing is designed to eliminate.

For example, using the example of FIG. 2, unit 0 may fail at month 12. Rebuilding the unit 0 layout onto the replacement unit results in a new wearout time of 36 months. However, unit 8, which started with a wearout time of 48 months, also has a remaining wearout time of 36 months. Thus, simply rebuilding unit 0 may not be optimal.

In this case, only two units have such a correlation, which may be tolerable. As an alternative, the rebuild operation may be altered to preserve the minimum wearout separation. One approach is to perform a two-step rebuild, where the layout for the failed unit is rebuilt onto a non-failed unit, and the layout of the non-failed unit is rebuilt onto the replacement unit. The choice of the non-failed unit is subject to the constraint that when complete, the system may retain the minimum wearout time separation.

Using the above example referenced above, at month 12, unit 15 has a remaining wearout time of 46.5 months. Given the target minimum wear time separation of 1.5 months, it is desirable that the result of the unit replacement has a wearout time of at least 48 months (46.5+1.5). The layout for unit 8 has an initial wearout time of 48 months, which meets this target. Thus, the layout of unit 8 may be rebuilt onto the replacement unit, and then the layout of 0 may be rebuilt onto the former unit 8.

The methods and techniques described herein may be utilized in any system where there is an access-dependent wearout mechanism. Furthermore, it should be noted that the invention can take the form of an entirely hardware embodiment, an entirely software embodiment or an embodiment containing both hardware and software elements. For example, in one embodiment, a system may include a flash memory device having a plurality of memory blocks, where at least one of the blocks has monitor data written therein, and the at least one block has been written to a plurality of times prior to writing the monitor data. The system may also include circuitry for addressing the blocks and a secondary memory storing a copy of the monitor data. Additionally, the system may include a storage controller and a plurality of flash memory devices.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 4:
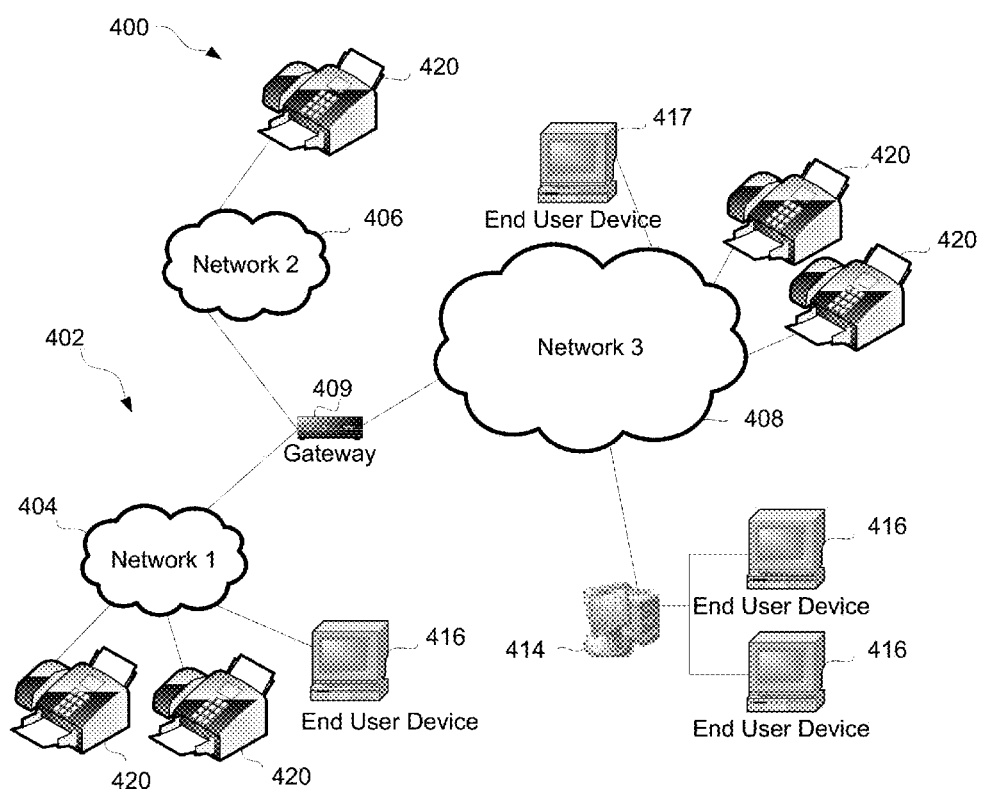
FIG. 4 illustrates a network architecture, in accordance with one embodiment.

FIG. 4 illustrates a network architecture 400, in accordance with one embodiment. As an option, the functionality and architecture of FIGS. 1-3 may be implemented in the context of the network architecture 400. However, the functionality and architecture of FIGS. 1-3 may be carried out in any desired environment. It should be noted that the aforementioned definitions may apply during the present description.

As shown in FIG. 4, a plurality of remote networks 402 are provided including a first remote network 404 and a second remote network 406. A gateway 407 may be coupled between the remote networks 402 and a proximate network 408. In the context of the present network architecture 400, the networks 404, 406 may each take any form including, but not limited to a LAN, a WAN such as the Internet, PSTN, internal telephone network, etc.

In use, the gateway 407 serves as an entrance point from the remote networks 402 to the proximate network 408. As such, the gateway 407 may function as a router, which is capable of directing a given packet of data that arrives at the gateway 407, and a switch, which furnishes the actual path in and out of the gateway 407 for a given packet.

Further included is at least one data server 414 coupled to the proximate network 408, and which is accessible from the remote networks 402 via the gateway 407. It should be noted that the data server(s) 414 may include any type of computing device/groupware. Coupled to each data server 414 is a plurality of user devices 416. Such user devices 416 may include a desktop computer, lap-top computer, hand-held computer, printer or any other type of logic. It should be noted that a user device 417 may also be directly coupled to any of the networks, in one embodiment.

A facsimile machine 420 or series of facsimile machines 420 may be coupled to one or more of the networks 404, 406, 408. It should be noted that databases and/or additional components may be utilized with, or integrated into, any type of network element coupled to the networks 404, 406, 408. In the context of the present description, a network element may refer to any component of a network.

Figure 5:
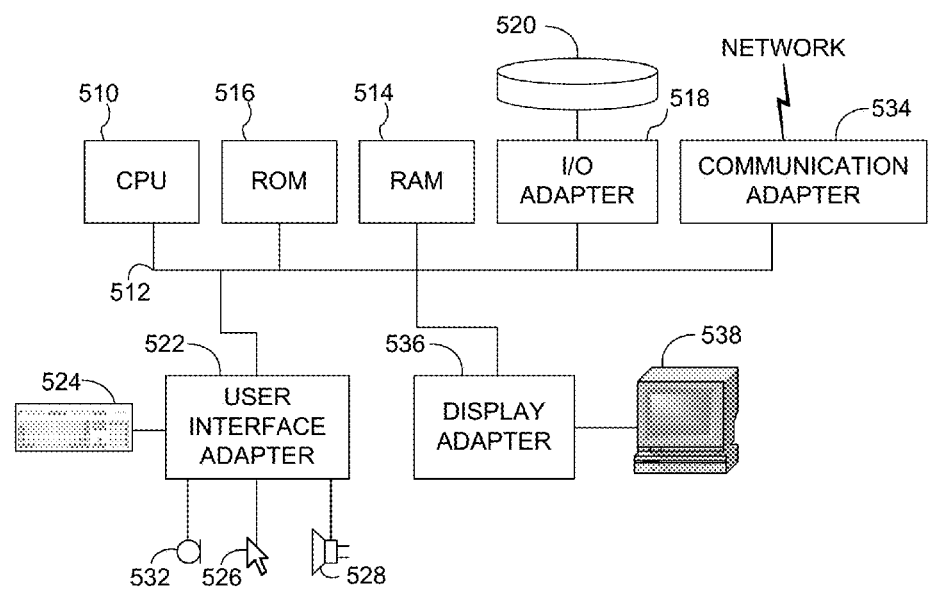
FIG. 5 shows a representative hardware environment that may be associated with the servers and/or clients of FIG. 4, in accordance with one embodiment.

FIG. 5 shows a representative hardware environment associated with a user device 416 of FIG. 4, in accordance with one embodiment. Such figure illustrates a typical hardware configuration of a workstation having a central processing unit 510, such as a microprocessor, and a number of other units interconnected via a system bus 512.

The workstation shown in FIG. 5 includes a Random Access Memory (RAM) 514, Read Only Memory (ROM) 516, an I/O adapter 518 for connecting peripheral devices such as disk storage units 520 to the bus 512, a user interface adapter 522 for connecting a keyboard 524, a mouse 526, a speaker 528, a microphone 532, and/or other user interface devices such as a touch screen and a digital camera (not shown) to the bus 512, communication adapter 534 for connecting the workstation to a communication network 535 (e.g., a data processing network) and a display adapter 536 for connecting the bus 512 to a display device 538.

The workstation may have resident thereon an operating system such as the Microsoft Windows® Operating System (OS), a MAC OS, or UNIX operating system. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    determining or receiving an amount of spare space to provide in an array of memory devices;
    allocating the spare space non-uniformly to the memory devices in the array; and
    skewing expected wearout times of the memory devices by controlling writing of data to the array according to the allocation of the spare space,
    wherein the amount of spare space is determined based on wearout times associated with each of the memory devices.

2. The method of claim 1, wherein the amount of spare space is determined based on a predefined wearout interval.

3. The method of claim 1, wherein a write workload is substantially even across available storage units in each of the memory devices.

4. The method of claim 1, further comprising allocating free space on each of the memory devices for wear leveling.

5. The method of claim 1, wherein allocating the spare space includes designating a number of available storage units for each memory device.

6. The method of claim 1, wherein each of the memory devices has a same storage capacity, wherein the spare space allocated to each memory device corresponds to a number of spare operational blocks per memory module.

7. The method of claim 1, wherein the controlling writing includes:
    writing first data to a first memory device of the array at a first number of writes per unit time;
    writing second data to a second memory device of the array at a second number of writes per unit time; and
    skewing expected wearout times of the memory devices by making the second number of writes per unit time less than the first number of writes per unit time.

8. The method of claim 7, wherein a number of available storage units on the first memory device is greater than a number of available storage units on the second memory device.

9. The method of claim 1, further comprising replicating data stored on a first of the memory devices on a replacement memory device according to an expected wearout of the first of the memory devices, wherein, upon replicating the data on the replacement memory device, remaining space on the replacement memory device is assigned as spare space.

10. The method of claim 1, wherein the memory devices are flash memory devices.

11. A system, comprising:
    a processor and logic integrated with and/or executable by the processor, the logic being configured to:
    determine or receive an amount of spare space to provide in an array of memory devices;
    allocate the spare space non-uniformly to the memory devices in the array; and
    skew expected wearout times of the memory devices by controlling writing of data to the array according to the allocation of the spare space,
    wherein the amount of spare space is determined based on wearout times associated with each of the memory devices.

12. The system of claim 11, wherein the amount of spare space is determined based on a wearout interval.

13. The system of claim 11, wherein a write workload is substantially even across available storage units in each of the memory devices.

14. The system of claim 11, further comprising allocating free space on each of the memory devices for wear leveling, wherein, upon replicating the data on a replacement memory device, remaining space on the replacement memory device is assigned as spare space.

15. The system of claim 11, wherein allocating the spare space includes designating a number of available storage units for each memory device, the number of available storage units for at least some of the memory devices being less than a total number of operational storage units of the memory device.

16. The system of claim 11, wherein each of the memory devices has a same storage capacity.

17. A computer program product, comprising a non-transitory computer readable storage medium having program code embodied therewith, the program code readable/executable by a processor to:
    determine or receive, by the processor, an amount of spare space to provide in an array of memory devices;
    allocate, by the processor, the spare space non-uniformly to the memory devices in the array; and
    skew, by the processor, expected wearout times of the memory devices by controlling writing of data to the array according to the allocation of the spare space,
    wherein the amount of spare space is determined based on wearout times associated with each of the memory devices.

18. The computer program product of claim 17, wherein a write workload is about even across available storage units in each of the memory devices, wherein a number of available storage units on a first of the memory devices is greater than a number of available storage units on a second memory device.

* * * * *